US010193552B1

United States Patent
Ji et al.

(10) Patent No.: US 10,193,552 B1
(45) Date of Patent: Jan. 29, 2019

(54) TERMINATION RESISTOR CALIBRATION CIRCUIT AND CONTROL METHOD THEREOF

(71) Applicant: LONTIUM SEMICONDUCTOR CORPORATION, Hefei Anhui (CN)

(72) Inventors: Xiangyu Ji, Hefei Anhui (CN); Cheng Tao, Hefei Anhui (CN); Yu Chen, Hefei Anhui (CN); Xi Xu, Hefei Anhui (CN); Jiaxi Fu, Hefei Anhui (CN)

(73) Assignee: LONTIUM SEMICONDUCTOR CORPORATION, Hefei, Anhui (CN)

( * ) Notice: Subject to any disclaimer, the term of this patent is extended or adjusted under 35 U.S.C. 154(b) by 0 days.

(21) Appl. No.: 16/017,373

(22) Filed: Jun. 25, 2018

(30) Foreign Application Priority Data

May 22, 2018 (CN) .......................... 2018 1 0493409

(51) Int. Cl.
  *H03K 19/00* (2006.01)
  *H03K 5/24* (2006.01)
(52) U.S. Cl.
  CPC .......... *H03K 19/0005* (2013.01); *H03K 5/24* (2013.01); *H03K 19/0008* (2013.01)
(58) Field of Classification Search
  None
  See application file for complete search history.

(56) References Cited

U.S. PATENT DOCUMENTS

| 6,940,303 | B2 * | 9/2005 | Vargas ..................... H03H 7/40 326/30 |
| 7,042,271 | B2 | 5/2006 | Chung et al. |
| 7,183,805 | B2 | 2/2007 | Wang et al. |
| 9,680,469 | B1 | 6/2017 | Tan et al. |
| 2003/0085736 | A1 * | 5/2003 | Tinsley .......... H03K 19/017527 326/81 |
| 2008/0024160 | A1 | 1/2008 | Ou-Yang et al. |
| 2018/0083624 | A1 | 3/2018 | Tang et al. |

FOREIGN PATENT DOCUMENTS

TW 201815068 A 4/2018

OTHER PUBLICATIONS

Taiwanese First Office corresponding to Application No. 107121663; dated Nov. 9, 2018.

* cited by examiner

*Primary Examiner* — Seokjin Kim
(74) *Attorney, Agent, or Firm* — Cantor Colburn LLP

(57) ABSTRACT

The termination resistor calibration circuit and a control method thereof are provided. The resistance of the termination resistor of the CML transmitter is directly calibrated, so that the error caused by duplicating the resistor can be avoided, which improves the calibration accuracy. In addition, no duplicated resistor and constant current source is required, which reduces the area occupied by the circuit. Further, the absolute current and the relative current are obtained from the bandgap module and thus have high accuracy. The output signal control module, the constant current source, and the termination resistors of the CML transmitter can be used for transmitting signals after the resistance calibration is finished, which improves the utilization of the circuit module.

5 Claims, 4 Drawing Sheets

TERMINATION RESISTOR CALIBRATION CIRCUIT AND CONTROL METHOD THEREOF

CROSS REFERENCE OF RELATED APPLICATION

The present application claims priority under 35 U.S.C. § 119 to Chinese Patent Application No. 201810493409.X, filed on May 22, 2018, the entire contents of which are incorporated herein by reference.

FIELD

The present disclosure relates to the field of data transmission, and in particular to a termination resistor calibration circuit and a control method thereof.

BACKGROUND

With the development of the electronic information technology, the amount of data to be transmitted and processed is ever increasing. Especially in fields of video transmission, data storage and the like, the amount of data to be transmitted increases with the increasing image resolution and storage space. Currently, a commercial serial interface transmits data at about 10 Gbps. When a signal is transmitted at such a high speed, reflection, crosstalk, standing waves, and the like may occur in the transmitted signal due to impedance mismatch, which has a serious impact on the signal quality, damages signal integrity, and affects reception of a receiver. Therefore, for a high-speed signal transmission circuit, a calibration circuit module is generally provided to perform matching and calibration on an output impedance of a transmitter to improve the signal transmission quality.

The calibration circuit module mainly includes adjustable resistors and a constant current source. Resistors having resistances proportional to a resistance of a termination resistor may function as adjustable resistors of the calibration circuit module. There may be multiple such resistors, which occupy a large area. The constant current source is used in combination with the adjustable resistors. In order to achieve a high accuracy and reduce an error of the current source, the constant current source generally has a great size, i.e., occupies a large area. In addition, the adjustable resistors are obtained by duplicating the termination resistor. Since an error exists between the duplicated adjustable resistor and the real resistor (i.e., the termination resistor), the configuration obtained by calibration may not be optimal. Further, the calibration circuit module is idle when the calibration is not performed, thus the calibration circuit has low utilization.

SUMMARY

In view of this, a termination resistor calibration circuit and a control method thereof are provided in the present disclosure, to make full use of an existing structure of a current mode logic (CML) transmitter, and control the CML transmitter to perform resistance calibration, so as to implement the impedance matching while reducing an area occupied by the circuit, reducing cost, improving calibration accuracy, and improving utilization of the circuit module.

In order to achieve the above objects, the following solutions are provided.

A termination resistor calibration circuit is provided. The termination resistor calibration circuit is connected to a current mode logic (CML) transmitter including a first termination resistor and a second termination resistor, and includes: a bandgap module, a current generation module, an off-chip resistor, a first on-chip resistor, a second on-chip resistor, a comparator, an output signal control module, and a calibration control module.

The bandgap module is configured to generate a reference voltage.

The current generation module is configured to generate an absolute current based on the reference voltage and a resistance of the off-chip resistor, and generate a relative current based on the reference voltage and a resistance of the first on-chip resistor.

The relative current flows through the second on-chip resistor.

One input terminal of the comparator is connected to a non-common terminal of the second on-chip resistor, the other input terminal of the comparator is connected to a non-common terminal of the first termination resistor of the CML transmitter, and an output terminal of the comparator is connected to the calibration control module.

The absolute current is inputted to a constant current source of the CML transmitter as a reference current.

The output signal control module is configured to: during resistance calibration, control a first electronic switch that is connected to the first termination resistor to be turned on, and control a second electronic switch that is connected to the second termination resistor of the CML transmitter to be turned off.

The calibration control module is configured to calibrate resistances of the first termination resistor and the second termination resistor of the CML transmitter.

In an embodiment, the termination resistor calibration circuit is connected to N CML transmitters, N is a positive integer greater than or equal to 2, and the termination resistor calibration circuit further includes: a selector connected between the other input terminal of the comparator and non-common terminals of first termination resistors of the N CML transmitters. The absolute current is inputted into a constant current source of each of the N CML transmitters as a reference current. The calibration control module is configured to calibrate, based on selection performed by the selector, resistances of the first termination resistor and the second termination resistor of each of the N CML transmitters.

A control method is provided. The control method is applied to the above termination resistor calibration circuit, and includes: outputting, by the output signal control module, a first drive control signal to control the first electronic switch to be turned on; outputting, by the output signal control module, a second drive control signal to control the second electronic switch to be turned off; and generating, by the calibration control module, a configuration signal based on an output signal of the comparator, where the configuration signal is used for adjusting a resistance of each of the first termination resistor and the second termination resistor, to calibrate resistances of the first termination resistor and the second termination resistor of the CML transmitter.

In an embodiment, the calibration control module calibrates resistances of the first termination resistor and the second termination resistor of the CML transmitter by using dichotomy.

In an embodiment, the calibration control module calibrates the resistance of the first termination resistor and the resistance of the second termination resistor of the CML transmitter by using an accumulating method.

Compared with the conventional technology, the technical solutions of the present disclosure have the following advantages.

The termination resistor calibration circuit is provided in the above technical solutions. The resistance of the termination resistor of the CML transmitter is directly calibrated, so that the error caused by duplicating the resistor can be avoided, which improves the calibration accuracy. In addition, no duplicated resistor and constant current source is required, which reduces the area occupied by the circuit. Further, the absolute current and the relative current are obtained from the bandgap module and thus have high accuracy. The output signal control module, the constant current source, and the termination resistor of the CML transmitter can be used for transmitting signals after the resistance calibration is finished, which improves the utilization of the circuit module.

BRIEF DESCRIPTION OF THE DRAWINGS

In order to more clearly illustrate technical solutions in embodiments of the present disclosure or in the conventional technology, the drawings to be used in the description of the embodiments or the conventional technology are briefly described hereinafter. It is apparent that, the drawings in the following description show only some embodiments of the present disclosure, and other drawings may be obtained by those skilled in the art from the drawings without creative efforts.

DETAILED DESCRIPTION OF EMBODIMENTS

The main idea of the present disclosure is to make full use of an existing basic structure of a CML transmitter and provide a corresponding control module to calibrate a resistance of a termination resistor, so that it is unnecessary to duplicate resistors, thereby reducing the area occupied by the circuit, reducing the cost, improving the calibration accuracy, and improving the utilization of the circuit module.

Technical solutions in embodiments of the present disclosure are clearly and completely described below in conjunction with drawings in the embodiments of the present disclosure. It is apparent that embodiments described below are only some embodiments of the present disclosure, rather than all of the embodiments. All other embodiments obtained by those skilled in the art based on the embodiments of the present disclosure without creative efforts fall within the protection scope of the present disclosure.

Next, terms involved in the present disclosure are explained in order to facilitate understanding of the solutions of the present disclosure.

TX is an abbreviation of Transmitter, which functions as an upstream transmission source of a signal in a high-speed signal transmission circuit, and transmits information to a receiving end by using a level signal that jumps.

RX is an abbreviation of Receiver, which is used in combination with TX and is used for receiving a signal level.

MOS transistor is a type of field-effect transistor, which has three terminals including a G terminal, an S terminal and a D terminal. If a certain voltage is applied to the G terminal, the MOS transistor is turned on and a current flows between the S terminal and the D terminal. If no appropriate voltage is applied to the G terminal, the MOS transistor is not turned on and no current flows between the S terminal and the D terminal.

Figure 1:
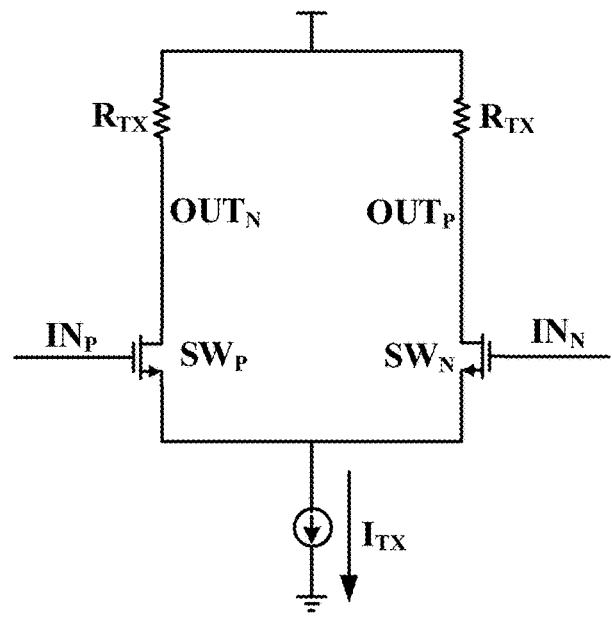
FIG. 1 is a schematic diagram of an N-input CML circuit.
Figure 2:
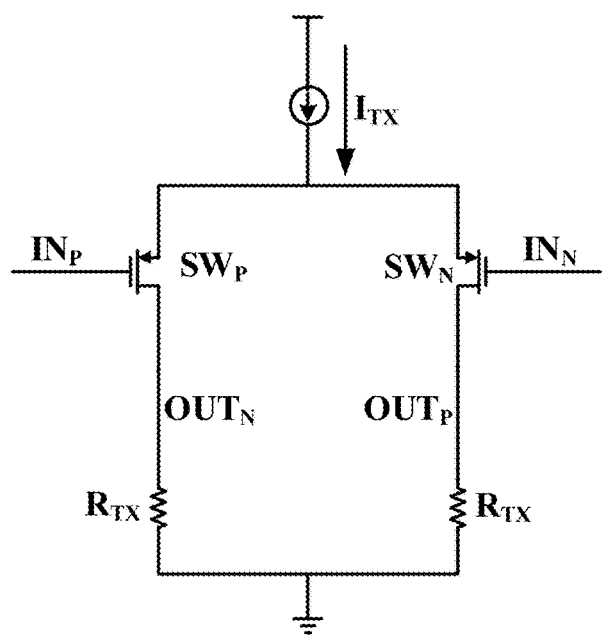
FIG. 2 is a schematic diagram of a P-input CML circuit.

CML is an abbreviation of Current Mode Logic. A CML transmitter is a logic circuit based on a differential pair structure, as shown in FIG. 1 and FIG. 2. $I_{TX}$ is a constant current source, which is connected to different termination resistors $R_{TX}$ by controlling switch transistors $SW_P$ and $SW_N$ to be turned on or turned off, to form a voltage difference between $OUT_P$ and $OUT_N$, so as to generate an output signal. According to the type of the MOS transistor functioning as the switch transistors $SW_P$ and $SW_N$, the CML may be an N-input CML or a P-input CML. The CML transmitter has advantages of low power consumption, low swing, low noise, high speed, high anti-interference ability, and the like, and is widely applied in high frequency signal circuits.

Signal reflection is described as follows. When transmitting an alternating current signal, a transmission line has an impedance, which is an inherent physical property and is referred to as characteristic impedance. If the characteristic impedance is not constant in the signal transmission process, that is, the characteristic impedance of the transmission path changes, energy of a part of the signal is reflected back along the original path to form reflection. The reflected signal is superposed on a subsequently transmitted signal, in which case the quality of the subsequent signal may be deteriorated.

Impedance matching is described as follows. In practical applications, the output impedance of TX is generally controlled to be as close as possible to the impedance of the transmission line to minimize reflection of a signal transmitted by TX. The output impedance of the CML transmitter is approximately equal to a resistance of the termination resistor $R_{TX}$. The case that the resistance of the termination resistor $R_{TX}$ is equal to the characteristic impedance of the transmission line is referred to as impedance matching.

Resistance calibration is described as follows. When chips are fabricated, the resistance of the termination resistor $R_{TX}$ changes with the adopted process, and cannot be exactly equal to the characteristic impedance of the transmission line. Therefore, it is required to calibrate the resistance of the termination resistor $R_{TX}$, so that the resistance of the termination resistor $R_{TX}$ is approximately equal to the characteristic impedance of the transmission line, thereby achieving impedance matching and reducing the reflection. The characteristic impedance of the transmission line is known in practice, that is, a calibration target is known before the resistance calibration is performed. In other words, a target resistance $R_{target}$ to which the resistance of the termination resistor $R_{TX}$ is adjusted is known.

BG is an abbreviation of Bandgap, which is utilized to generate a voltage with a minimal temperature drift, as a reference voltage source for the entire chip system.

AC Couple is a type of connections of a high-speed signal transmission path. In a case that a coupling capacitor is provided on the transmission line, only a small alternating current signal may be transmitted to the receiving end via the capacitor, and direct current components of the TX and the RX are blocked.

DC Couple is a type of connections of the high-speed signal transmission path. In a case that no coupling capacitor is provided on the transmission line, the direct current is connected to the RX via the transmission line, and the direct current signal and the alternating current signal are transmitted via the transmission line.

Figure 3:
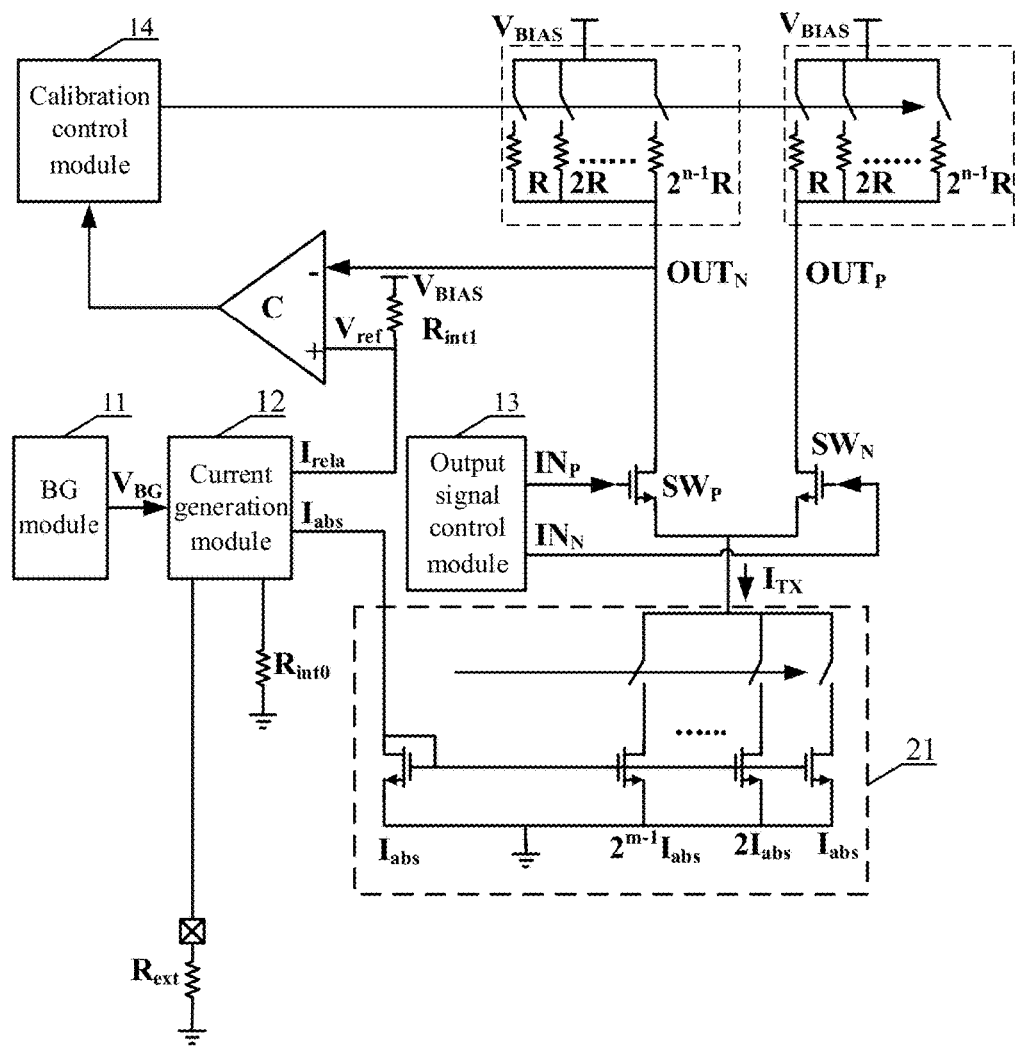
FIG. 3 is a schematic diagram of a termination resistor calibration circuit according to an embodiment of the present disclosure.

A termination resistor calibration circuit is provided according to an embodiment of the present disclosure. Referring to FIG. 3, the termination resistor calibration circuit is connected to a CML transmitter including a first termination resistor and a second termination resistor. The termination resistor calibration circuit includes a BG module 11, a current generation module 12, an off-chip resistor $R_{ext}$, a first on-chip resistor $R_{int0}$, a second on-chip resistor $R_{int1}$, a comparator C, an output signal control module 13, and a calibration control module 14.

The BG module 11 is configured to generate a reference voltage $V_{BG}$.

The current generation module 12 is configured to generate an absolute current $I_{abs}$ based on the reference voltage $V_{BG}$ and a resistance $R_{ext}$ of the off-chip resistor $R_{ext}$, where $I_{abs}=V_{BG}/R_{ext}$, and generate a relative current $I_{rela}$ based on the reference voltage $V_{BG}$ and a resistance $R_{int0}$ of the first on-chip resistor $R_{int0}$, where $I_{rela}=V_{BG}/R_{int0}$. Since the off-chip resistor is an independent component outside the chip and has a high production accuracy, the absolute current $I_{abs}=V_{BG}/R_{ext}$ obtained based on the reference voltage $V_{BG}$ and the resistance $R_{ext}$ of the off-chip resistor does not change with factors such as a process and a temperature. In addition, since the resistance of the on-chip resistor deviates with the process, the temperature, and the like, and thus is not accurate, the current generated based on the resistance of the on-chip resistor is unpredictable.

The relative current $I_{rela}$ flows through the second on-chip resistor $R_{int1}$. A ratio of the resistance $R_{int1}$ of the second on-chip resistor $R_{int1}$ to the resistance $R_{int0}$ of the first on-chip resistor $R_{int0}$ does not change with factors such as the process and the temperature. The relative current $I_{rela}$ and the resistance $R_{int1}$ of the second on-chip resistor $R_{int1}$ that is proportional to the resistance $R_{int0}$ of the first on-chip resistor $R_{int0}$ and is expressed as $R_{int1}=k*R_{int0}$, are utilized to obtain a required comparison voltage $V_{ref}$ which may be expressed as $V_{ref}=V_{BIAS}-I_{rela}*R_{int1}=V_{BIAS}-V_{BG}/R_{int0}*k*R_{int0}=V_{BIAS}-k*V_{BG}$. That is, the required comparison voltage $V_{ref}$, i.e., a voltage $V_{ref}$ at a non-common terminal of the second on-chip resistor, may be obtained by setting the ratio of the resistance $R_{int1}$ of the second on-chip resistor $R_{int1}$ to the resistance $R_{int0}$ of the first on-chip resistor $R_{int0}$.

One input terminal of the comparator C is connected to the non-common terminal of the second on-chip resistor $R_{int1}$. One terminal of the second on-chip resistor $R_{int1}$ that is connected to a bias voltage $V_{BIAS}$ is referred to as a common terminal of the second on-chip resistor $R_{int1}$, and the other terminal of the second on-chip resistor $R_{int1}$ is referred to as the non-common terminal of the second on-chip resistor $R_{int1}$. The other input terminal of the comparator C is connected to a non-common terminal of the first termination resistor $R_{TX}$ of the CML transmitter. An output terminal of the comparator C is connected to the calibration control module 14. One terminal of each of the first termination resistor $R_{TX}$ and the second termination resistor $R_{TX}$ that is connected to the bias voltage $V_{BIAS}$ is referred to as a common terminal of the first termination resistor Rx or the second termination resistor $R_{TX}$, and the other terminal of each of the first termination resistor $R_{TX}$ and the second termination resistor $R_{TX}$ is referred to as the non-common terminal of the first termination resistor Rx or the second termination resistor $R_{TX}$. The non-common terminal of the second on-chip resistor $R_{int1}$ may be connected to a non-inverting input terminal or an inverting input terminal of the comparator C. In a case that the non-common terminal of the first termination resistor $R_{TX}$ is connected to the inverting input terminal of the comparator C, the non-common terminal of the second on-chip resistor $R_{int1}$ is connected to the non-inverting input terminal of the comparator C. In a case that the non-common terminal of the first termination resistor $R_{TX}$ is connected to the non-inverting input terminal of the comparator C, the non-common terminal of the second on-chip resistor $R_{int1}$ is connected to the inverting input terminal of the comparator C. The comparator C may output different comparison results in the calibration process depending on different connections. Therefore, when the input terminal of the comparator C to which the non-common terminal of the first termination resistor $R_{TX}$ is connected changes, it is required to change determination logic of the calibration control module 14. FIG. 3 shows the case that the non-common terminal of the second on-chip resistor $R_{int1}$ is connected to the non-inverting input terminal of the comparator C, and the non-common terminal of the first termination resistor $R_{TX}$ is connected to the inverting input terminal of the comparator C.

Each of the first termination resistor $R_{TX}$ and the second termination resistor $R_{TX}$ of the CML transmitter is an adjustable resistor formed by multiple resistor branches connected in parallel with each other. Each of the resistor branches includes an electronic switch. The calibration control module 14 transmits a configuration signal to control the electronic switch in each of the resistor branches of the adjustable resistor to be turned on or turned off, so as to adjust a resistance of each of the first termination resistor $R_{TX}$ and the second termination resistor $R_{TX}$. For n resistor branches of the termination resistor, a resistance of an i-th resistor branch is $2^{i-1}R$, where i is an integer in an interval (0, n]. The termination resistor $R_{TX}$ having different resistances may be obtained by turning on electronic switches in different resistor branches. In a case that the resistance of the termination resistor $R_{TX}$ is closest to the characteristic impedance of the transmission line, the resistance calibration is achieved.

The absolute current $I_{abs}$ is inputted to a constant current source 21 of the CML transmitter as a reference current. The constant current source 21 is configured to output a required constant current $I_{TX}$. In FIG. 3, the constant current source 21 is a current mirror. The current mirror accurately duplicates the reference current by using a circuit structure of the current mirror to obtain a required target current. An accurately duplicated current, i.e., the constant current $I_{TX}$, may be obtained by turning on or turning off different branches of the current mirror. The constant current source 21 includes m branches, and the number of mirror tubes in the branches are $2^{m-1}, 2^{m-2}, \ldots, 2$ and 1, and currents in the branches are $2^{m-1}I_{abs}, 2^{m-2}I_{abs}, \ldots, 2I_{abs}$, and $I_{abs}$, respectively. Appropriate values of k and $I_{TX}$ are set based on an equation $I_{TX}*R_{target}=k*V_{BG}$.

The output signal control module 13 is configured to: during resistance calibration, control a first electronic switch $SW_P$ that is connected to the first termination resistor $R_{TX}$ to be turned on, and control a second electronic switch $SW_N$ that is connected to the second termination resistor $R_{TX}$ of the CML transmitter to be turned off. The two electronic switches $SW_P$ and $SW_N$ of the CML transmitter are MOS transistors. The electronic switches $SW_P$ and $SW_N$ are turned on or turned off based on different inputted voltages. Specifically, a voltage inputted to $SW_P$ is at a high level, and a voltage inputted to $SW_N$ is at a low level. In this case, $SW_P$ is turned on for the current $I_{TX}$ to flow through, and $SW_N$ is turned off and no current flows. The voltage at the non-common terminal $OUT_P$ is $V_{BIAS}$, and the voltage at the non-common terminal $OUT_N$ is expressed as $V_{BIAS}-I_{TX}*R_{TX}$, and a voltage difference $V_{TX}$ may be generated between the two non-common terminals and is expressed as $V_{TX}=I_{TX}*R_{TX}$. The $V_{TX}$ is a signal outputted by the CML transmitter when operating normally. During resistance calibration, the voltage at the non-common terminal $OUT_N$ of the first termination resistor $R_{TX}$ connected to the first electronic switch $SW_P$ is used as a change adjustment signal and is compared with $V_{ref}$. During normal operation of the CML transmitter, the output signal control module 13 outputs control signals $IN_P$ and $IN_N$ to control the $SW_P$ and the $SW_N$ to be turned on and turned off, respectively, so as to obtain different output signals. During resistance calibration, an output state of the CML transmitter is maintained. In this embodiment, the $IN_P$ is maintained at a high level and the $IN_N$ is maintained at a low level, that is, the $SW_P$ is maintained to be turned on and the $SW_N$ is maintained to be turned off. When resistance calibration is finished, the CML transmitter returns to the normal operation state.

The calibration control module 14 is configured to calibrate resistances of the first termination resistor and the second termination resistor of the CML transmitter. Specifically, the resistances of the two termination resistors of the CML transmitter may be calibrated by using dichotomy or an accumulating method. According to the dichotomy, first, all the resistor branches of the termination resistor $R_{TX}$ are turned off, and then an electronic switch K1 in a first resistor branch is turned on. When K1 is turned on, if the comparator C outputs a high level, K1 is maintained at the on state, and an electronic switch K2 in a second resistor branch is turned on. When K2 is turned on, if the comparator C outputs a low level, K2 is turned off, and an electronic switch K3 in a third resistor branch is turned on. Similarly, when K3 is turned on, if the comparator C outputs a high level, K3 is maintained at the on state, and an electronic switch in a next resistor branch (i.e., a fourth resistor branch) is turned on; and if the comparator C outputs a low level, K3 is turned off, and an electronic switch in a next resistor branch (i.e., the fourth resistor branch) is turned on. The process is repeatedly performed until an electronic switch Kn in an n-th resistor branch is turned on. When Kn is turned on, Kn is maintained at the on state if the comparator C outputs a high level, and Kn is turned off if the comparator C outputs a low level. Finally, states of respective electronic switches K1, K2, ..., and Kn are stored as an optimal configuration for achieving resistance calibration.

According to the accumulating method, control signals [M1, M2, ..., Mn] for electronic switches of the resistor branches of the termination resistor $R_{TX}$ form a binary digit string, where M1, M2, ..., and Mn are respectively the highest bit, the second highest bit, ..., and the lowest bit. $Mi=0$ indicates that an electronic switch in an i-th resistor branch is turned off, and $Mi=1$ indicates that the electronic switch in the i-th resistor branch is turned on. First, all bits of the binary digit string [M1, M2, ..., Mn] are set to zero, then the binary digit string is increased by one, and it is determined whether an output of the comparator jumps. If the output jumps, the current binary digit string is stored to obtain states of the respective electronic switches K1, K2, ..., and Kn, i.e., the optimal configuration. If the output does not jump, the binary digit string is increased by one until the output of the comparator jumps.

It should be noted that the present disclosure may be applied to the AC couple connection, such as DP, USB3.0, USB3.1, PCIE and other high-speed interfaces, and may also be applied to the DC couple connection, such as USB2.0. In the case that the present disclosure is applied to the DC couple connection, it is required to adjust the $I_{TX}$ or $V_{ref}$ to perform the resistance calibration if the interface is connected to a downstream circuit.

Figure 4:
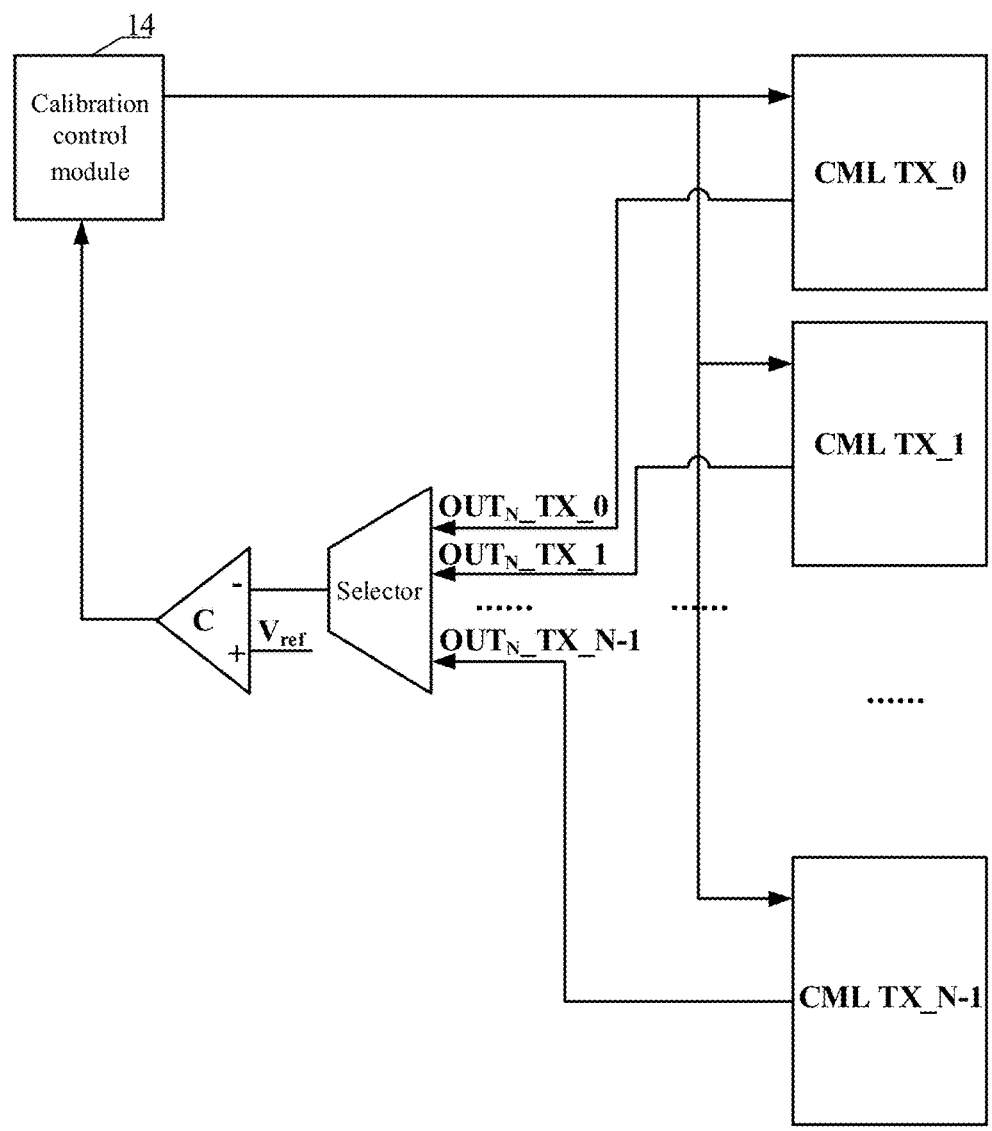
FIG. 4 is a schematic diagram of a termination resistor calibration circuit according to another embodiment of the present disclosure.

A termination resistor calibration circuit is provided according to another embodiment of the present disclosure. Referring to FIG. 4, the termination resistor calibration circuit is connected to N CML transmitters (i.e., CML TX_0, CML TX_1, ..., and CML TX_N−1 shown in FIG. 4), where N is a positive integer greater than or equal to 2. As compared with the termination resistor calibration circuit shown in FIG. 3, the termination resistor calibration circuit according to this embodiment further includes a selector. The selector is connected between the other input terminal of the comparator C and non-common terminals $OUT_N\_TX\_0$, $OUT_N\_TX\_1$, ..., and $OUT_N\_TX\_N-1$ of first termination resistors of the N CML transmitters.

The absolute current $I_{abs}$ is inputted into a constant current source 21 of each of the N CML transmitters. The constant current sources 21 of the N CML transmitters output the same current, that is, the constant current sources 21 of the N CML transmitters have the same configuration.

The calibration control module 14 is configured to calibrate, based on selection of the selector, resistances of two termination resistors of each of the N CML transmitters. The optimal configuration for each CML transmitter obtained by calibrating resistances of termination resistors of each CML transmitter is latched for calibrating resistances of termination resistors of each of the N CML transmitters. One can refer to FIG. 3 for modules not shown in FIG. 4.

Figure 5:
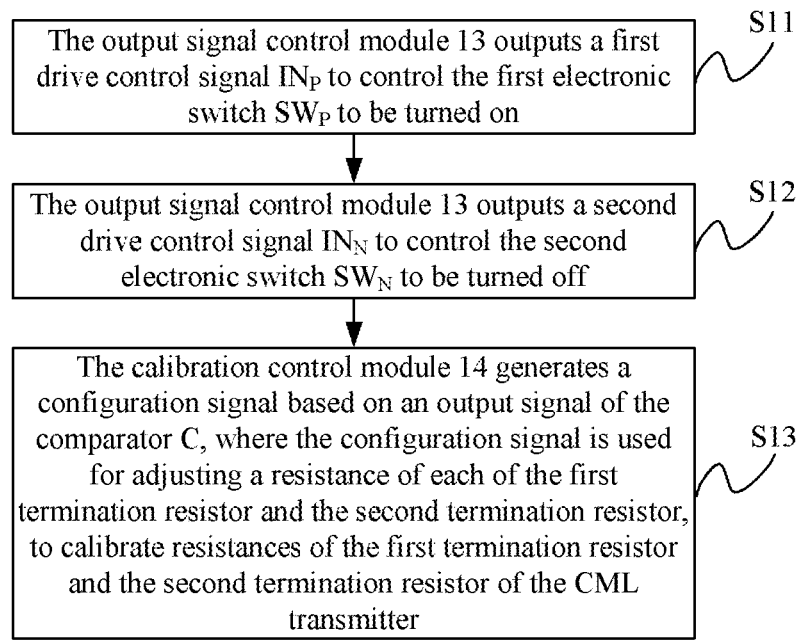
FIG. 5 is a flowchart of a control method applied to the termination resistor calibration circuit shown in FIG. 3 according to an embodiment of the present disclosure.

A control method applied to the termination resistor calibration circuit shown in FIG. 3 is further provided according an embodiment of the disclosure. Referring to FIG. 5, the control method includes the following steps S11 to S13.

In S11, the output signal control module 13 outputs a first drive control signal $IN_P$ to control the first electronic switch $SW_P$ to be turned on.

In S12, the output signal control module 13 outputs a second drive control signal $IN_N$ to control the second electronic switch $SW_N$ to be turned off.

In S13, the calibration control module 14 generates a configuration signal based on an output signal of the comparator C. The configuration signal is used for adjusting a resistance of each of the first termination resistor and the second termination resistor, to calibrate resistances of the first termination resistor and the second termination resistor of the CML transmitter.

Optionally, the calibration control module calibrates resistances of the first termination resistor and the second termination resistor of the CML transmitter by using dichotomy or an accumulating method.

For the above method embodiment, for simplicity of description, the method is described as a series of combinations of actions for convenience of the description, but those skilled in the art should understand that, the present disclosure is not limited by the described action sequence, because some steps may be performed in other orders or simultaneously according to the present disclosure.

The device embodiments described above are merely illustrative, and units described as separate components may or may not be physically separate. Some or all of the units may be selected according to actual needs to achieve purposes of the solutions in the embodiments. Those skilled in the art may understand and implement the embodiments without creative efforts.

In this specification, relationship terms such as "first", and "second" are only intended to distinguish an entity or operation from another, rather than to require or implicate that such an actual relationship or order exists among the entities or operations. Furthermore, terms such as "include", "comprise" or any other variants are intended to be non-exclusive. Therefore, a process, method, article or device including multiple elements includes not only the elements but also other elements that are not enumerated, or further includes the elements inherent for the process, method, article or device. Unless expressively limited otherwise, the statement "comprising (including) a . . . " does not exclude a case where other same elements may exist in the process, method, article or device.

Embodiments in this specification are described in a progressive manner, each of the embodiments emphasizes differences from other embodiments, and the same or similar parts among the embodiments can be referred to each other.

Based on the above description of the disclosed embodiments, those skilled in the art can implement or use the present disclosure. It is obvious for those skilled in the art to make many modifications to these embodiments. The general principle defined herein may be applied to other embodiments without departing from the spirit or scope of the present disclosure. Therefore, the present disclosure is not limited to the embodiments illustrated herein, but should be defined by the widest scope consistent with the principle and novel features disclosed herein.

The invention claimed is:

1. A termination resistor calibration circuit, wherein the termination resistor calibration circuit is connected to a current mode logic (CML) transmitter comprising a first termination resistor and a second termination resistor, and comprises:
    an off-chip resistor;
    a first on-chip resistor;
    a bandgap module configured to generate a reference voltage;
    a current generation module configured to generate an absolute current based on the reference voltage and a resistance of the off-chip resistor, and generate a relative current based on the reference voltage and a resistance of the first on-chip resistor, wherein the absolute current is inputted to a constant current source of the CML transmitter as a reference current;
    a second on-chip resistor, wherein the relative current flows through the second on-chip resistor;
    a comparator, wherein one input terminal of the comparator is connected to a non-common terminal of the second on-chip resistor, the other input terminal of the comparator is connected to a non-common terminal of the first termination resistor of the CML transmitter, and an output terminal of the comparator is connected to a calibration control module;
    an output signal control module configured to: during resistance calibration, control a first electronic switch that is connected to the first termination resistor of the CML transmitter to be turned on, and control a second electronic switch that is connected to the second termination resistor of the CML transmitter to be turned off; and
    the calibration control module configured to calibrate resistances of the first termination resistor and the second termination resistor of the CML transmitter.

2. The termination resistor calibration circuit according to claim 1, wherein the termination resistor calibration circuit is connected to N CML transmitters, N is a positive integer greater than or equal to 2, and the termination resistor calibration circuit further comprises:
    a selector connected between the other input terminal of the comparator and non-common terminals of first termination resistors of the N CML transmitters, wherein
    the absolute current is inputted into the constant current source of each of the N CML transmitters as a reference current; and
    the calibration control module is configured to calibrate resistances of the first termination resistor and the second termination resistor of one of the N CML transmitters selected by the selector.

3. A control method, applied to the termination resistor calibration circuit according to claim 1, and comprising:
    outputting, by the output signal control module, a first drive control signal to control the first electronic switch to be turned on;
    outputting, by the output signal control module, a second drive control signal to control the second electronic switch to be turned off; and
    generating, by the calibration control module, a configuration signal based on an output signal of the comparator, wherein the configuration signal is used for adjusting a resistance of each of the first termination resistor and the second termination resistor, to calibrate resistances of the first termination resistor and the second termination resistor of the CML transmitter.

4. The control method according to claim 3, wherein the calibration control module calibrates resistances of the first termination resistor and the second termination resistor of the CML transmitter by using dichotomy.

5. The control method according to claim 3, wherein the calibration control module calibrates the resistance of the first termination resistor and the resistance of the second termination resistor of the CML transmitter by using an accumulating method.

* * * * *